've
United States Patent

Michaud et al.

[11] Patent Number: 6,162,779
[45] Date of Patent: *Dec. 19, 2000

[54] COLD CLEANING COMPOSITION BASED ON ALKANES OR CYCLOALKANES AND AN ORGANIC COMPOUND COMPRISING A KETONE GROUP

[75] Inventors: Pascal Michaud, Saint-Gratian; Jean-Jacques Martin, Bois-Colombes, both of France

[73] Assignee: Elf Atochem, S.A., Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/945,076

[22] PCT Filed: Apr. 17, 1996

[86] PCT No.: PCT/FR96/00583

§ 371 Date: Jan. 27, 1996

§ 102(e) Date: Jan. 27, 1998

[87] PCT Pub. No.: WO96/33261

PCT Pub. Date: Oct. 24, 1996

[30] Foreign Application Priority Data

Apr. 20, 1995 [FR] France .................................. 95 04726

[51] Int. Cl.⁷ .................. C11D 3/22; C23G 3/22
[52] U.S. Cl. .......... 510/245; 510/175; 510/176; 510/407; 510/505
[58] Field of Search .................... 510/505, 407, 510/245, 175, 176

[56] References Cited

U.S. PATENT DOCUMENTS

| | | | |
|---|---|---|---|
| 3,983,047 | 9/1976 | Vinson | 510/407 |
| 4,483,783 | 11/1984 | Albanese | 106/311 |
| 5,011,620 | 4/1991 | Dishart et al. | 252/118 |
| 5,118,358 | 6/1992 | van Brunt et al. | 510/407 |
| 5,376,299 | 12/1994 | Russell et al. | 510/407 |
| 5,525,254 | 6/1996 | Reininger | 510/407 |
| 5,783,551 | 7/1998 | Mirsky | 510/407 |
| 5,811,380 | 9/1998 | Weitz | 510/175 |
| 5,954,886 | 9/1999 | Michaud et al. | 134/2 |

FOREIGN PATENT DOCUMENTS

| | | |
|---|---|---|
| 3-153799 | 7/1991 | Japan . |
| 6-322393 | 11/1994 | Japan . |
| 7-331291 | 12/1995 | Japan . |

Primary Examiner—Yogendra Gupta
Assistant Examiner—Gregory E. Webb
Attorney, Agent, or Firm—Millen, White, Zelano & Branigan, P.C.

[57] ABSTRACT

A composition for cleaning solid surfaces, under cold conditions, in non-aqueous medium consists essentially of a mixture of alkanes or cycloalkanes and at least one organic compound comprising at least one ketone function, the composition having a flashpoint above or equal to 40° C. and below 55° C., measured according to ASTM standard D56-70.

18 Claims, No Drawings

COLD CLEANING COMPOSITION BASED ON ALKANES OR CYCLOALKANES AND AN ORGANIC COMPOUND COMPRISING A KETONE GROUP

The present invention relates to a composition for cleaning solid surfaces, under cold conditions, in a non-aqueous medium based on a mixture of alkanes or cycloalkanes and on at least one organic compound comprising at least one ketone function.

This composition can be used in particular for applications of degreasing solid surfaces such as metal components, cement, ceramics, glass and synthetic materials which have been soiled by machine oils or greases, and/or for their temporary protection.

This composition can also be used for defluxing printed circuits. This defluxing operation consists in removing the soldering flux.

Hitherto, hydrocarbon solvents were used for these various operations, and mainly chlorinated solvents such as, in particular, 1,1,1-trichloroethane known in the field under the name T111, as well as chlorofluoroalkanes such as 1,1,2-trichloro-1,2,2-trifluoroethane, known in the field under the name F113.

However, these chloro and fluorochloro compounds are suspected of being responsible for the decrease in the stratospheric ozone layer which provides protection against certain types of radiation.

Following the Montreal Protocol which resulted from recent international discussions on the environment, these chloro or fluorochloro compounds will, before long, have to be replaced by substitutes having little or no destructive effect on stratouipheric ozone.

British patent application GB 2,175,004 proposes a cleaning composition for removing greases from metal or plastic surfaces, comprising from 85 to 97 parts by weight of non-aromatic hydrocarbons containing aliphatic and/or cycloaliphatic compounds and from 3 to 15 parts by weight of aromatic compounds containing at least one alkyl group having from 8 to 18 carbon atoms.

However, this composition has the drawback of containing non-negligible amounts of aromatic compounds.

On account, in particular, of their relatively irritant nature, the use of such compounds in degreasing applications under cold conditions is becoming increasingly limited, or even prohibited.

A composition for cleaning solid surfaces under cold conditions, in non-aqueous medium, has now been found, this composition consisting essentially of at least one mixture of alkanes or a mixture of cycloalkanes and of at least one organic compound comprising at least one ketone function, characterized in that the mixture of alkanes or the mixture of cycloalkanes and the organic compound comprising at least one ketone function have a flashpoint above or equal to 40° C. and below 55° C., and that the composition has a flashpoint above or equal to 40° C. and below 55° C., preferably between 40° C. and 50° C., measured according to ASTM standard D56-70.

By way of example of a mixture of alkanes which can be used according to the present invention, mention may be made of petroleum fractions having a carbon number ranging from 8 to 12 and preferably ranging from 9 to 11.

Among these petroleum fractions, the invention relates most particularly to those which have a flashpoint above or equal to 40° C. and preferably below 55° C. and which have a distillation range of from 150° C. to 195° C. and preferably of from 155° C. to 185° C.

Among these petroleum fractions, it is preferred to use those which contain virtually no aromatic compounds.

As illustrations of such petroleum fractions, mention may be made of the isoparaffinic solvents sold by the company Total under the names Isane IP 155 (flashpoint of 41° C.) and Isane IP 165 (flashpoint of 48° C.), and the petroleum fraction Isopar G marketed by the company Exxon Chemical (flashpoint of 42° C.).

It would not be departing from the scope of the invention if a virtually pure paraffin or isoparaffin was used, provided that its flashpoint, measured according to ASTM standard D56-70, is above or equal to 40° C. and below 55° C.

An example of such a paraffin which may be mentioned is the n-$C_{10}$ paraffin marketed by the company Cepsa.

In the present text, the term mixture of cycloalkanes denotes a mixture of saturated mono- or polycyclic hydrocarbons, optionally substituted with one or more alkyl residues of general formula (I) $C_nH_{2(n+1-a)}$ in which n is an integer ranging from 5 to 26 and a represents the number of rings.

Preferably, mixtures of cycloalkanes of formula (I) in which n is between 5 and 12 and preferably between 7 and 10, and a=1 or 2 and preferably a=1 (monocyclic compounds) will be used according to the present invention.

By way of illustration of such mixtures of cycloalkanes which can be used according to the present invention, mention may be made of the mixtures of (alkyl)cycloalkanes obtained by catalytic hydrogenation of petroleum fractions consisting of aromatic compounds such as, in particular, alkylbenzenes and divinylbenzenes and cyclic olefins.

The mixtures of (alkyl)cycloalkanes thus obtained essentially consist of saturated cyclic hydrocarbons which may have one or more alkyl residues having from 1 to 4 carbon atoms.

As illustrations of such mixtures, mention may be made of diethylcyclohexanes (mixture of cis and trans 1,2, 1,3 and 1,4 isomers) and mixtures containing two or more of the following compounds: methylethylcyclohexanes, methylpropylcyclohexanes, ethylpropylcyclohexanes, dipropylcyclohexanes, methylbutylcyclohexanes, ethylbutylcyclohexanes.

Among all these mixtures, it in preferred to use those which have a flashpoint above or equal to 40° C. and below 55° C. and which have a distillation range of from 150° C. to 185° C.

According to the present invention, petroleum fractions known as naphthenic fractions, having a flashpoint above or equal to 40° C. and below 55° C. and having a distillation range of from 150° C. to 190° C., may also be used as mixture of cycloalkanes.

These naphthenic fractions essentially consist of compounds of formula (I) in which a=1 and n is generally between 5 and 12. Illustrations of such compounds which may be mentioned are diethylcyclopentanes, mono-, di- and triethylcyclohexanes, ethyldimethylcyclohexanegs and cyclooctane.

Examples of such naphthenic fractions which may be mentioned are the naphthenic solvents sold by Exxon Chemical under the name Nappar 10.

According to the present invention, the organic compounds comprising one or more ketone functions preferably have a flashpoint above or equal to 40° C. and below 55° C.

Illustrations of such compounds which may be mentioned are ethyl amyl ketone, ethyl butyl ketone, di-n-propyl ketone, duisobutyl ketone, cyclohexanone, 2-methylcyclohexanone, 3-methylcyclohexanone and 4-mothylcyclohexanone.

The composition according to the present invention comprises weight proportions of the mixture of alkanes or of the mixture of cycloalkanes ranging from 70% to 99%, and preferably ranging from 85% to 95%, and weight proportions of the organic compound comprising at feast one ketone function ranging from 30% to 1%, and preferably ranging from 15% to 5%.

The composition according to the present invention can be used in applications for the degreasing under cold conditions, in a non-aqueous medium, of solid surfaces such as metal components, cement, glass and synthetic materials which have been soiled by oils or greases used during machining operations, and/or for their temporary protection.

Most particularly, the composition can be used in so-called "non-closed" applications, such as cleaning with a brush or cloth, or spraying.

The composition may be stabilized.

Stabilizers which may be used are nitro derivatives such as nitromethane, nitroethane, nitropropane and nitrotoluene; ethers or acetals such as dimethoxymethane, 1,3-dioxolane and dimethoxyethane; amines such as triethylamine, dipropylamine and dimethylamine; phosphorus derivatives such an triiuodecyl phosphite and truisooctyl phosphate.

The composition may also contain one or more odour-masking agents.

Examples of such products which may be mentioned are vanillin and its derivatives, essences of pine, and limonene and its derivatives.

These compounds are used in very small amounts, generally between 0.01 and 0.1 part by weight per 100 parts by weight of the composition.

The Composition according to the invention has the advantage of being readily removed after the degreasing operation.

The examples which follow illustrate the invention.

In these examples, the flashpoints are determined according to ASTM standard D56-70.

The following compounds were used:
- Petroleum fraction ($C_9$–$C_{11}$) Isopar G (referred to hereinbelow as Iso G). This petroleum fraction has a distillation range of from 158° C. to 176° C. and a flashpoint of 42° C.
- Naphthenes "Nappar 10" (referred to hereinbelow as Nap 10). This cycloalkane fraction has a distillation range of from 166° C. to 188° C. and a flashpoint of 45° C.
- Diethylcyclohexanes (mixture of isomers, referred to hereinblow as DECH). Flashpoint of 46° C.
- Ethyl amyl ketone (referred to hereinbelow as EAK) which has a flashpoint of 48° C.

EXAMPLE 1

A 40×30 mm stainless steel grille in weighed after coating with a whole oil or water-soluble oil supplied by Castrol, Shell, Mobil or Elf, and is degreased at room temperature (about 20° C.) by manual stirring in a vessel containing a composition consisting of 90% by weight of the petroleum fraction Iso G and 10% by weight of EAK.

The composition has a flashpoint of 42° C. according to ASTM standard D56-70.

In 30 seconds, no further trace of oil remains on the grille.

The grille is subsequently removed from the vessel and then placed 50 cm from a nozzle blowing air at 25° C.

The grille is dry after 69 seconds.

EXAMPLES 2 to 5

The process is performed as in Example 1, with various compositions.

The constituents and the proportions of these used are reported in the single table below.

In this table, the percentages of the constituents of the various compositions are expressed by weight.

SINGLE TABLE

| Constituents of the composition | Examples | | | |
|---|---|---|---|---|
| | 2 | 3 | 4 | 58 |
| Iso G | 95% | | | |
| Nap 10 | | 90% | 95% | |
| DECH | | | | 90% |
| EAK | 5% | 10% | 5% | 10% |
| Flashpoint of the composition (°C.) | 42 | 44 | 45 | 47 |
| Speed of drying (seconds) | 75 | 85 | 87 | 83 |

The compositions of Examples 2 to 5 have virtually identical cleaning performances. In 30 seconds, the grille is totally free of oil.

What is claimed is:

1. A non-aqueous composition for cleaning under cold conditions, consisting of, on a weight basis, 70–99%, of (A) at least one alkane or at least one cycloalkane end of 1–30% of (B) at least one organic compound comprising at least one ketone function, characterized in that both (A) the at least one alkane or the at least one cycloalkane and (B) the organic compound comprising at least one ketone function each, has a flashpoint above or equal to 40° C. and below 55° C., and that the composition has a flashpoint above or equal to 40° C. and below 55° C., measured according to ASTM standard D56-70, and optional amounts of an odor-masking agent and of a stabilizing agent.

2. A composition according to claim 1, having a flashpoint of between 40° C. and 50° C.

3. A composition according to claim 1, wherein said at least one alkane is a petroleum fraction having a carbon number ranging from 8 to 12.

4. A composition according to claim 3, characterized in that the petroleum fraction has a distillation range of from 150° C. to 195° C.

5. A composition according to claim 3, wherein the petroleum fraction has a carbon number ranging from 9 to 11.

6. A composition according to claim 1, wherein said at least one cycloalkane is a mixture of saturated mono- or polycyclic hydrocarbons, optionally substituted with one or more alkyl residues, of general formula $$C_nH_{2(n+1-a)} \tag{I}$$

in which n is an integer ranging from 5 to 12 and a is equal to 1 or 2.

7. A composition according to claim 6, characterized in that the mixture of cycloalkanes of formula (I) is a mixture of (alkyl)cycloalkanes having a distillation range of from 150° C. to 185° C.

8. A composition according to claim 6, characterized in that the mixture of cycloalkanes of formula (I) is a naphthenic fraction which has a distillation range of from 150° C. to 190° C.

9. A composition according to claim 1, characterized in that the organic compound comprising at least one ketone function is ethyl amyl ketone.

10. In a method of degreasing a solid surface soiled by machine oils or greases comprising contacting said surface at room temperature with a cleaning composition, the improvement wherein the cleaning composition comprises a composition according to claim 9.

11. In a method of defluxing printed circuits comprising contacting said printed circuits at room temperature with a defluxing agent to remove solder, the improvement wherein the defluxing agent comprises a composition according to claim 9.

12. In a method of degreasing a solid surface soiled by machine oils or greases comprising contacting said surface at room temperature with a cleaning composition, the improvement wherein the cleaning composition comprises a composition according to claim 1.

13. In a method of defluxing printed circuits comprising contacting said printed circuits at room temperature with a defluxing agent to remove solder, the improvement wherein the defluxing agent comprises a composition according to claim 1.

14. A composition according to claim 1, wherein the at least one alkane or at least one cycloalkane is present in an amount by weight of 85% to 95%, and the organic compound comprising at least one ketone function is present in an amount by weight of 15% to 5%.

15. A composition according to claim 1, wherein said organic compound comprising at least one ketone function is ethyl amyl ketone, ethyl butyl ketone, di-n-propyl ketone, cyclohexanone, 2-methylcyclohexanone, 3-methylcyclohexanone or 4-methylcyclohexanone.

16. A composition according to claim 15, wherein said at least one alkane is a petroleum fraction having a carbon number ranging from 8 to 12, and wherein said at least one cycloalkane is a mixture of saturated mono- or polycyclic hydrocarbons, optionally substituted with one or more alkyl residues, of general formula $$C_nH_{2(n+1-a)} \qquad (I)$$

in which n is an integer ranging from 5 to 12 and a is equal to 1 or 2.

17. A composition according to claim 1, wherein said at least one alkane is a petroleum fraction having a carbon number ranging from 8 to 12, and wherein said at least one cycloalkane is a mixture of saturated mono- or polycyclic hydrocarbons, optionally substituted with one or more alkyl residues, of general formula $$C_nH_{2(n+1-a)} \qquad (I)$$

in which n is an integer ranging from 5 to 12 and a is equal to 1 or 2.

18. A composition according to claim 1, wherein said organic compound comprising at least one ketone function is cyclohexanone, 2-methylcyclohexanone, 3-methylcyclohexanone or 4-methylcyclohexanone.

* * * * *

UNITED STATES PATENT AND TRADEMARK OFFICE
CERTIFICATE OF CORRECTION

PATENT NO. : 6,162,779
DATED : December 19, 2000
INVENTOR(S) : Pascal Michaud et al.

It is certified that error appears in the above-identified patent and that said Letters Patent is hereby corrected as shown below:

Title page,
Please correct the first Inventor's residence from "Saint-Gratian" to -- Saint-Gratien --.

Column 4,
Line 28, please change "end" to read -- and --.

Signed and Sealed this

Eleventh Day of December, 2001

*Attest:*

NICHOLAS P. GODICI
*Attesting Officer*    *Acting Director of the United States Patent and Trademark Office*